United States Patent
Itakura et al.

(10) Patent No.: US 6,770,808 B2
(45) Date of Patent: Aug. 3, 2004

(54) THERMOELECTRIC MODULE AND METHOD OF ASSEMBLING THE THERMOELECTRIC MODULE IN A RADIATING MEMBER

(75) Inventors: Masato Itakura, Toyota (JP); Hirotsugu Sugiura, Hekinan (JP); Shunji Sakai, Tokyo (JP)

(73) Assignees: Aisin Seiki Kabushiki Kaisha, Kariya (JP); Oki Electric Industry Co., Ltd., Tokyo (JP)

( * ) Notice: Subject to any disclaimer, the term of this patent is extended or adjusted under 35 U.S.C. 154(b) by 233 days.

(21) Appl. No.: 10/083,598

(22) Filed: Feb. 27, 2002

(65) Prior Publication Data

US 2002/0157698 A1 Oct. 31, 2002

(30) Foreign Application Priority Data

Feb. 27, 2001 (JP) ...................................... P.2001-052246

(51) Int. Cl.$^7$ .......................... H01L 35/34; H01L 35/28; H01L 35/30; H01L 21/00
(52) U.S. Cl. ....................... 136/201; 136/203; 136/205; 257/930; 257/53; 438/54; 438/55
(58) Field of Search ................................ 136/200, 201, 136/203, 205, 242; 257/930, 53; 438/54, 55

(56) References Cited

PUBLICATIONS

K. I. Uemura, et al., pp. 52–55, "Thermoelectric Semiconductor and its Application" Published by Nikkan Kogyo Shinbonsha, 1998.

*Primary Examiner*—Carol Chaney
*Assistant Examiner*—Thomas H. Parsons
(74) *Attorney, Agent, or Firm*—Oblon, Spivak, McClelland, Maier & Neustadt, P.C.

(57) ABSTRACT

A thermoelectric module includes plural thermoelectric semiconductor chips connected in series, first and second substrates, plural first and second electrodes formed on the first and second substrates, first solder through which the first and second electrodes are bonded to end portions of the thermoelectric semiconductor chips. The first substrate includes two or more protrusions protruding toward opposite sides with respect to the second substrate when being viewed vertically. A method of assembling a thermoelectric module in a radiating member includes the steps of mounting the first substrate on a radiating member through the second solder having a liquidus temperature lower than a solidus temperature of the first solder; holding the protrusions by leading edges of support arms where the second solder is melted to push the first substrate toward the radiating member under pressure while rocking the first substrate in a direction orthogonal to the pushing direction.

5 Claims, 5 Drawing Sheets

THERMOELECTRIC MODULE AND METHOD OF ASSEMBLING THE THERMOELECTRIC MODULE IN A RADIATING MEMBER

BACKGROUND OF THE INVENTION

1. Field of the Invention

The present invention relates to a thermoelectric module used in, for example, a temperature controller for a semiconductor device and a method of assembling the thermoelectric module in a radiating member.

2. Description of the Related Art

For example, a thermoelectric module used in a temperature controller for maintaining a constant temperature of a laser diode is shown in FIGS. 10 and 11. The thermoelectric module shown in those figures is designed such that a plurality of lower electrodes 4 formed on a lower substrate 2 and a plurality of upper electrodes 5 formed on an upper substrate 3 are bonded to the respective end portions of a plurality of thermoelectric semiconductor chips 6 through first solder. The plurality of thermoelectric semiconductor chips 6 thus structured are connected in series to each other through the plurality of electrodes 4 and 5, and the respective lower electrodes 4 bonded to both end ones of those thermoelectric semiconductor chips 6, thus connected in series to each other, are soldered to corresponding lead wires 9. The lower substrate 2 and the upper substrate 3 are substantially identical in the dimensional configuration with each other. A lower surface of the lower substrate 2 is thickly covered with second solder 7 in advance, and an upper surface of the upper substrate 3 is thickly covered with third solder 8 in advance. The liquidus temperature of the second solder 7 (melting point in case of eutectic solder) is set to be lower than the solidus temperature of the first solder (melting point in case of eutectic solder), and the liquidus temperature of the third solder 8 is set to be lower than the solidus temperature of the second solder 7.

The thermoelectric module 1 is used in a state where the lower substrate 2 is bonded and assembled to a butterfly package (radiating member) B through the second solder 7 (refer to FIGS. 12 and 13), and an endothermic member (for example, a semiconductor device) not shown is bonded onto the upper substrate 3 through the third solder 8. In order to satisfactorily exhibit the performance of the thermoelectric module 1, it is necessary to reduce heat resistances between the endothermic and radiating members and the respective substrates 2, 3, particularly, a heat resistance between the lower substrate 2 and the butterfly package B as much as possible. To achieve this, up to now, the thermoelectric module 1 is mounted on the butterfly package B that has been heated to a slightly higher temperature than the liquidus temperature of the second solder 7 through the second solder 7 and the lower substrate 2 as shown in FIGS. 12 and 13, and side center portions of the upper substrate 3 are held between a pair of support arms A. After the second solder 7 is melted by a heat transmitted from the butterfly package B, the lower substrate 2 is pushed toward the butterfly package B under pressure while being rocked horizontally. This process allows foreign material such as air bubbles or dust to be removed from the interior of the melted second solder 7, and the second solder 7 to be thinned and uniformed in thickness, thereby enabling a reduction in the heat resistance between the lower substrate 2 and the butterfly package B.

In order to facilitate the soldering of the lead wires 9 to the lower electrodes 4, as shown in FIGS. 14 and 15, another conventional thermoelectric module is equipped with a protrusion 2a that protrudes relative to the upper substrate 3 at a side of the lower substrate 2A where the lead wires 9 are drawn (thermoelectric module 1).

In the above-mentioned related art that holds the upper substrate 3 between the paired support arms A to bond the lower substrate 2 onto the butterfly package B, since a force that is exerted on the lower substrate 2 from the support arms A is transmitted through the thermoelectric semiconductor chips 6, the force is exerted on bonding portions of the semiconductor chips 6 and the lower and upper electrodes 4 and 5 through the first solder 1. Therefore, when the liquidus temperature of the second solder 7 and the solidus temperature of the first solder 1 are close to each other, since strengths of the bonding portions of the thermoelectric semiconductor chips 6 and the lower and upper electrodes 4, 5 through the first solder 1 are deteriorated, there arises such a problem that the bonding portions are partially broken due to the above-mentioned force with the result that the thermoelectric module 1 may be broken.

As a manner for solving the above problem, there has been proposed that, in the above-mentioned thermoelectric module 1A structured as shown in FIGS. 14 and 15, a center portion of the protrusion 2a of the lower substrate 2A where no lead wires 9 is disposed is pushed by a single support arm A under pressure and horizontally rocked to bond the lower substrate 2A of the thermoelectric module 1A to the butterfly package B through the second solder 7A. However, in this example, since the lower substrate 2A must be pushed under pressure from only one end portion of the lower substrate 2A by the support arm A, an opposite side of the lower substrate 2A floats up, and foreign material such as air bubbles or dust is incompletely removed from the interior of the melted second solder 7A with the result that the second solder 7A cannot be thinned and uniformed in thickness. Therefore, a heat resistance between the lower substrate 2A and the butterfly package B cannot be satisfactorily reduced.

SUMMARY OF THE INVENTION

The present invention has been made to solve the above-mentioned problems with the related art, and therefore an object of this invention is to provide a thermoelectric module and a method of assembling the thermoelectric module in a radiating member, which can prevent bonding portions of thermoelectric semiconductor chips and electrodes from being broken.

Another object of this invention is to provide a thermoelectric module and a method of assembling the thermoelectric module in a radiating member, which can satisfactorily reduce a heat resistance between a lower substrate and a butterfly package.

To achieve the above objects, according to a first aspect of this invention, there is provided a thermoelectric module, comprising: a plurality of thermoelectric semiconductor chips; first and second substrates; a plurality of first and second electrodes formed on said first and second substrates, respectively; and a first solder through which said first and second electrodes are bonded to respective end portions of said thermoelectric semiconductor chips in order to connect the plural thermoelectric semiconductor chips in series, said first substrate being made to include at least two protrusions that protrude toward opposite sides which appear upon at-a-right-angle projection of the second substrate onto the first substrate.

In the thermoelectric module according to this invention, it is preferable that concave portions, convex portions or aperture portions may be formed in the protrusions of said first substrate.

Also, according to a second aspect of this invention, there is provided a method of assembling a thermoelectric module in a radiating member, comprising the steps of: mounting the first substrate of the thermoelectric module according to the first aspect of the invention on a radiating member through the second solder having a liquidus temperature lower than a solidus temperature of the first solder; holding the respective protrusions of the first substrate by leading edges of corresponding support arms in a state where the second solder is melted, and pushing the first substrate toward the radiating member under pressure while rocking the first substrate in a direction orthogonal to the pushing direction.

In the method of assembling the thermoelectric module in the radiating member according to this invention, it is preferable that the leading edges of the support arms are engaged with the concave portions, the convex portions or the aperture portions of the respective protrusions, and the first substrate is pushed under pressure and rocked by the support arms.

Also, in the method of assembling the thermoelectric module in the radiating member according to this invention, it is preferable that a temperature difference between a liquidus temperature of the second solder and a solidus temperature of the first solder is set to be lower than 40° C.

BRIEF DESCRIPTION OF THE DRAWINGS

These and other objects and advantages of this invention will become more fully apparent from the following detailed description taken with the accompanying drawings in which.

DETAILED DESCRIPTION OF THE PREFERRED EMBODIMENTS

Now, a description will be given in more detail of preferred embodiments of this invention with reference to the accompanying drawings.

(First Embodiment)

Figure 1:
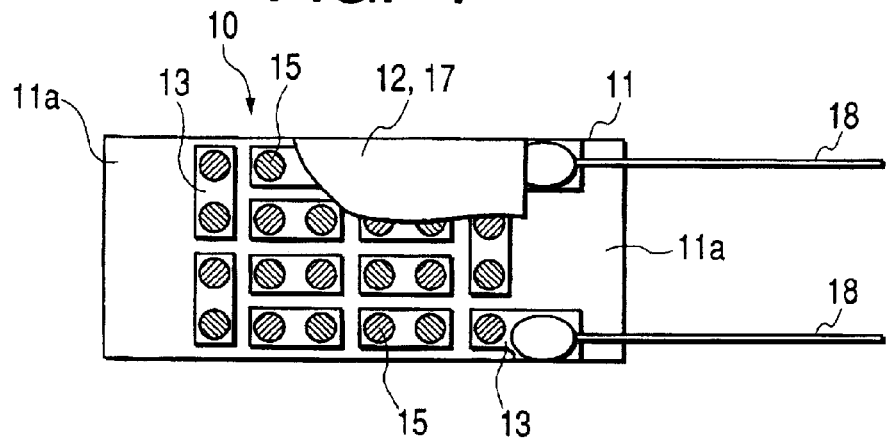
FIG. 1 is a partially broken-down plan view showing a thermoelectric module according to a first embodiment of this invention.
Figure 2:
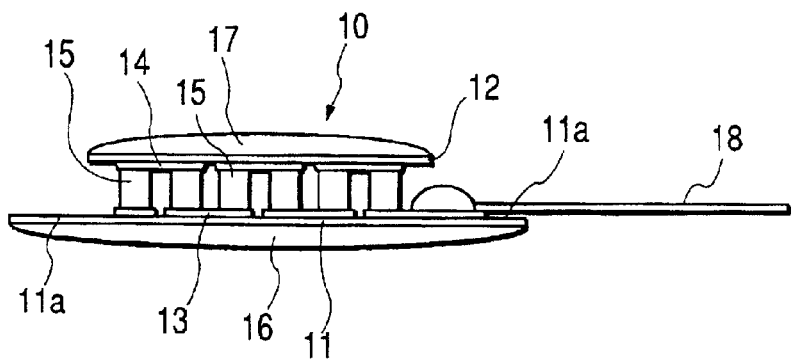
FIG. 2 is a front view showing the thermoelectric module shown in FIG. 1.

First, a thermoelectric module according to a first embodiment of this invention will be described with reference to FIGS. 1 and 2.

Referring to those figures, 24 thermoelectric semiconductor chips 15 arranged in 6 rows×4 columns are connected in series to each other in such a manner that a plurality of lower electrodes (first electrodes) 13 formed on a lower substrate (first substrate) 11 and a plurality of upper electrodes (second electrodes) 14 formed on an upper substrate (second substrate) 12 are bonded to the respective end portions of those thermoelectric semiconductor chips 15 through first solder, and both ends of those lower electrodes 13 that are connected in series are soldered with lead wires 18, respectively. The respective substrates 11 and 12 are formed of rectangular ceramic plates, and the lower substrate 11 is formed with a pair of protrusions 11a that protrude relative to both ends of the upper substrate 12 in a longitudinal direction thereof when being viewed vertically from the upper side. Both ends of the lower electrodes 13, each of which is soldered with the lead wire 18, extend on one (right side in FIGS. 1 and 2) of those protrusions 11a. The respective electrodes 13 and 14 are formed by subjecting the surfaces of the respective substrates 11 and 12 to electroless plating through metallized layers, respectively, and second solder 16 and third solder 17 are thickly formed on the rear surfaces of the respective lower and upper substrates 11 and 12. The first solder is solder of Sn/B=95/5 (232° C. in solidus temperature, 240° C. in liquidus temperature), the second solder 16 is eutectic solder of Sn/Ag=96.5/3.5 (221° C. in melting point), and the third solder 17 is eutectic solder of Bi/Sn=58/42 (138.5° C. in melting point).

Figure 3:
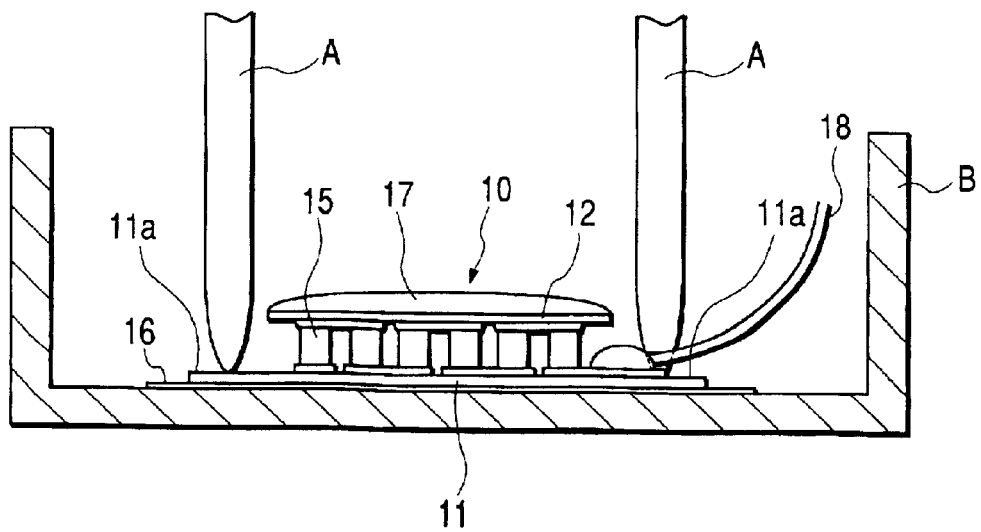
FIG. 3 is a partially broken-down front view showing a method of assembling the thermoelectric module according to the first embodiment in the radiating member.

Now, a method of assembling the thermoelectric module 10 according to the first embodiment in a butterfly package (radiating member) B will be described with reference to FIG. 3. The lower substrate 11 of the thermoelectric module 10 is mounted on the butterfly package B that has been mounted on a heater (not shown) and heated to 225 to 230° C. through the second solder 16 so that the second solder 16 is melted by a heat transmitted from the butterfly package B. Then, the respective leading edges of the pair of support arms A are abutted against the respective protrusions 11a to hold the lower substrate 11, and the lower substrate 11 is pushed under pressure toward the butterfly package B without being slanted while the lower substrate 11 is rocked in a direction orthogonal to a pushing direction. This process allows the lower substrate 11 to be pushed toward the butterfly package B under pressure without being slanted and simultaneously to be rocked in the direction orthogonal to the pushing direction, with the results that foreign material such as air bubbles or dust is extruded laterally from the interior of the second solder 16 so as to be removed, and the second solder 16 is thinned and uniformed in thickness. After completion of the above process, the butterfly package B is dismounted from the heater, and the second solder 16 is solidified. With the process, the bonding and assembling of the thermoelectric module 10 with respect to the butterfly package B are completed.

In this situation, forces by which the lower substrate 11 is pushed toward the butterfly package B under pressure and rocked in the direction orthogonal to the pushing direction are transmitted directly to the lower substrate 11 after being given to the respective protrusions 11a from the leading edges of the respective support arms A. Thus, the forces are transmitted not through the thermoelectric semiconductor chips 15. Therefore, the forces are not exerted on the bonding portions of the thermoelectric semiconductor chips 15 and the electrodes 13, 14 through the first solder.

A change in resistance between both of the lead wires 18 before and after the thermoelectric module 10 according to the first embodiment has been thus assembled in the butterfly package B has been measured to confirm whether the thermoelectric module 10 has been assembled therein without being broken. If the change in resistance between both of the lead wires 18 before and after assembling is within 0.5%, it is judged that the assembling is good. In the first embodiment, as shown in Table 1, it has been judged that no defective product existed in 22 test products, and the results were good as a whole.

A carrier (not shown) on which a semiconductor devices such as a laser diode (not shown) whose temperature is controlled, is mounted, is attached onto the upper substrate 12 through the third solder melted in the same manner as that described above. In this situation, since forces by which the carrier is pushed toward the upper substrate 12 under pressure and also rocked in a direction orthogonal to the pushing direction are received by the respective thermoelectric semiconductor chips 15, the forces are exerted on the bonding portions of the thermoelectric semiconductor chips 15 and the respective electrodes 13, 14 through the first solder. However, since a temperature difference between the liquidus temperature of the third solder 17 and the solidus temperature of the first solder is large, even if the thermoelectric module 10 is heated up to a temperature at which the third solder 17 is melted, the strength of the bonding portions through the first solder is not deteriorated, and therefore the bonding portions of the thermoelectric semiconductor chips 15 and the respective electrodes 13, 14 through the first solder are not broken.

(Second Embodiment)

Figure 4:
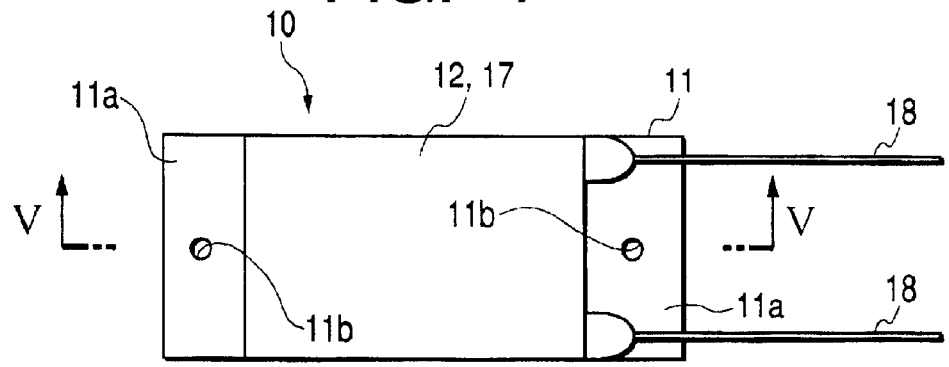
FIG. 4 is a plan view showing a thermoelectric module according to a second embodiment of this invention.
Figure 5:
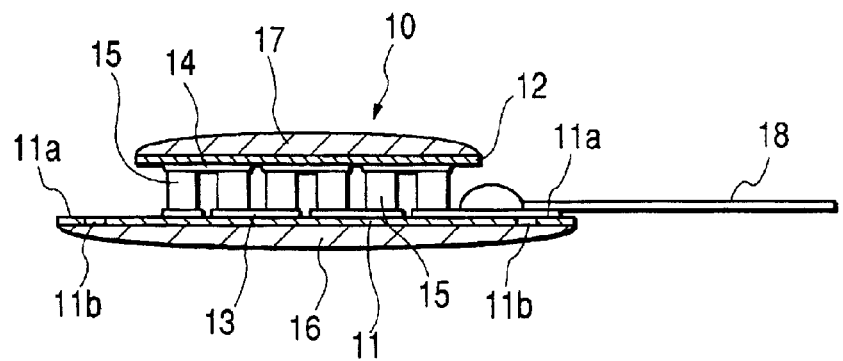
FIG. 5 is a cross-sectional view taken along a line V—V of FIG. 4.
Figure 6:
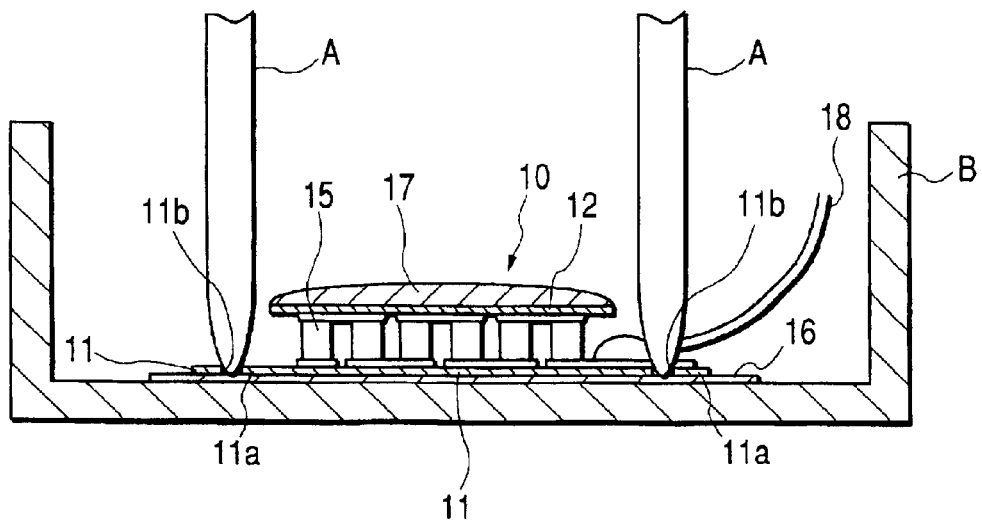
FIG. 6 is a cross-sectional view showing a method of assembling the thermoelectric module according to the second embodiment in the radiating member when being viewed from the front side.

FIGS. 4 and 5 are diagrams showing a thermoelectric module according to a second embodiment of this invention. A thermoelectric module according to the second embodiment differs from that in the first embodiment in that aperture portions are defined in the center portions of the respective protrusions 11a of the lower substrate 11, and other structures are identical with those in the first embodiment. FIG. 6 is a diagram showing a method of assembling the thermoelectric module 10 of the second embodiment in the butterfly package B. The assembling method according to the second embodiment is identical with that of the first embodiment except that the leading edges of the respective support arms A are fittingly inserted into the respective aperture portions 11b to hold the lower substrate 11. According to the method of the second embodiment, since the leading edges of the support arms A and the lower substrate 11 are always surely held without being laterally slit by fittingly inserting the leading edges of the respective support arms A into the respective aperture portions 11b, the rock in the direction orthogonal to the pushing direction is ensured, and a precision in the positioning of the thermoelectric module 10 with respect to the butterfly package B is also improved.

As a result of investigating whether the thermoelectric module 10 according to the second embodiment has been assembled into the butterfly package B without being broken in the same method as that described above, or not, it has been judged that no defective product existed in 22 test products and the results were good as a whole, as shown in Table 1.

(Third Embodiment)

Figure 7:
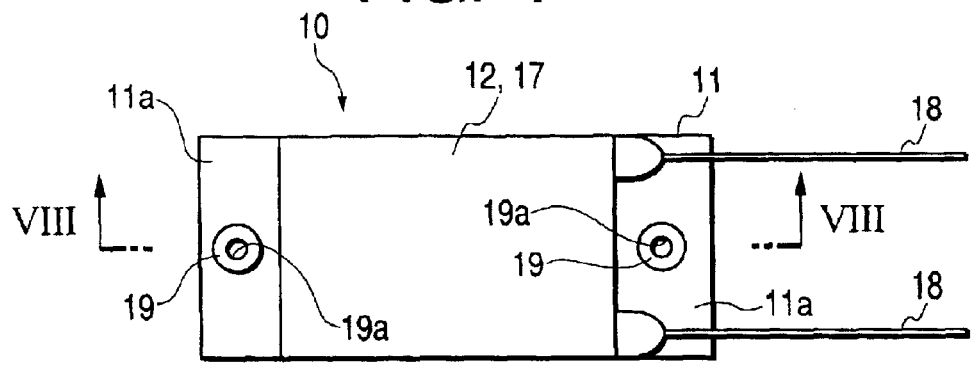
FIG. 7 is a plan view showing a thermoelectric module according to a third embodiment of this invention.
Figure 8:
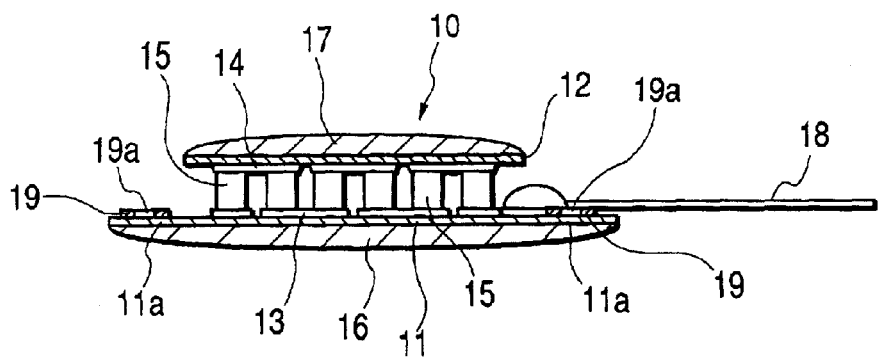
FIG. 8 is a cross-sectional view taken along a line VIII—VIII of FIG. 7.
Figure 9:
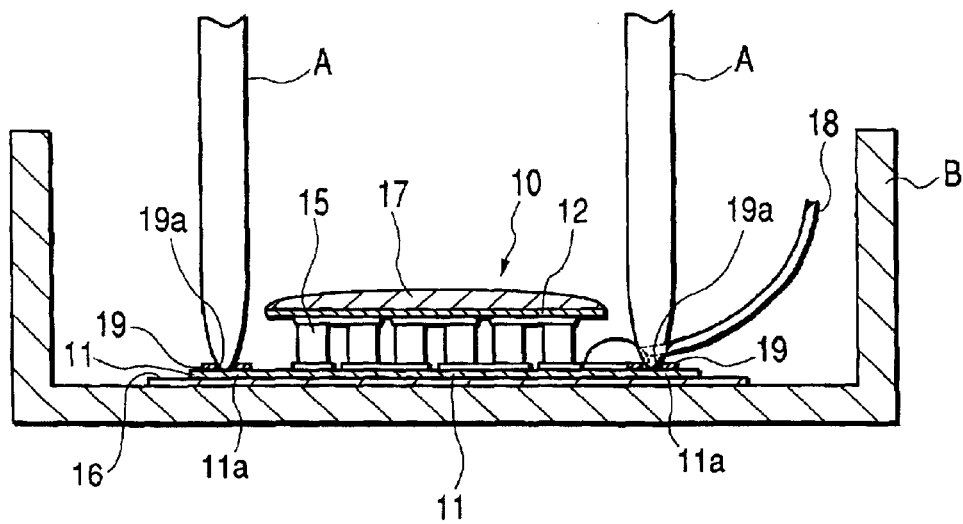
FIG. 9 is a cross-sectional view showing a method of assembling the thermoelectric module according to the third embodiment in the radiating member when being viewed from the front side.

FIGS. 7 and 8 are diagrams showing a thermoelectric module according to a third embodiment of this invention. The thermoelectric module 10 according to the third embodiment differs from that of the first embodiment in that metal-eyelet shaped convexes 19 are disposed in the centers of the respective protrusions 11a of the lower substrate 11, and concaves 19a are defined by circular holes formed in the centers of the respective convexes 11a so as to reach the surfaces of those convexes 11a. Other structures are identical with those in the first embodiment. The convexes 19 are formed by electroless plating together with the formation of the lower electrodes 13. FIG. 9 is a diagram showing a method of assembling the thermoelectric module 10 of the third embodiment in the butterfly package B. The assembling method of the third embodiment is identical with the assembling method of the first embodiment except that the leading edges of the respective support arms A are fittingly inserted into the corresponding concaves 19a to support the lower substrate 11. Likewise, in the method of the third embodiment, the leading edges of the respective support arms A are engaged with the corresponding convexes 19a to always surely hold the leading edges of the support arms A and the lower substrate 11 without being slid laterally. Therefore, the rocking of the lower substrate 11 in a direction orthogonal to the pushing direction is ensured, and a precision in the positioning of the thermoelectric module 10 with respect to the butterfly package B is also improved.

As a result of investigating whether the thermoelectric module 10 according to the third embodiment has been assembled into the butterfly package B without being broken in the same method as that described above, or not, it has been judged that no defective product existed in 22 test products and the results were good as a whole, as shown in Table 1.

TABLE 1

|  | 1st Embodiment | 2nd Embodiment | 3rd Embodiment | Comparative Example 1 |
|---|---|---|---|---|
| The number of defects after bonding | 0/22 | 0/22 | 0/22 | 5/22 |
| Judgment | ○ | ○ | ○ | X |

COMPARATIVE EXAMPLE 1

Figure 10:
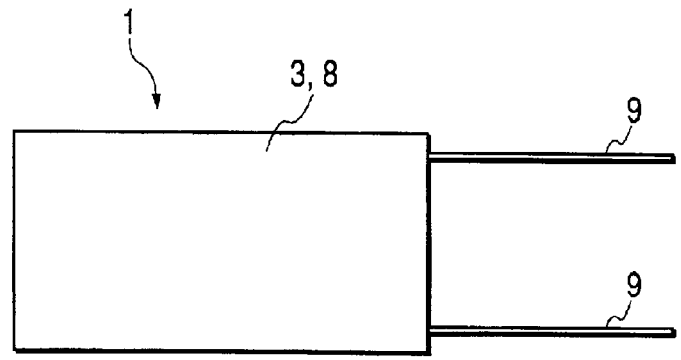
FIG. 10 is a plan view showing an example of a thermoelectric module in a related art.
Figure 11:
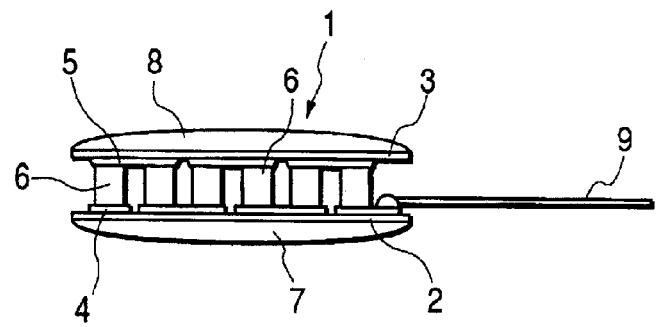
FIG. 11 is a front view showing the thermoelectric module shown in FIG. 10.
Figure 12:
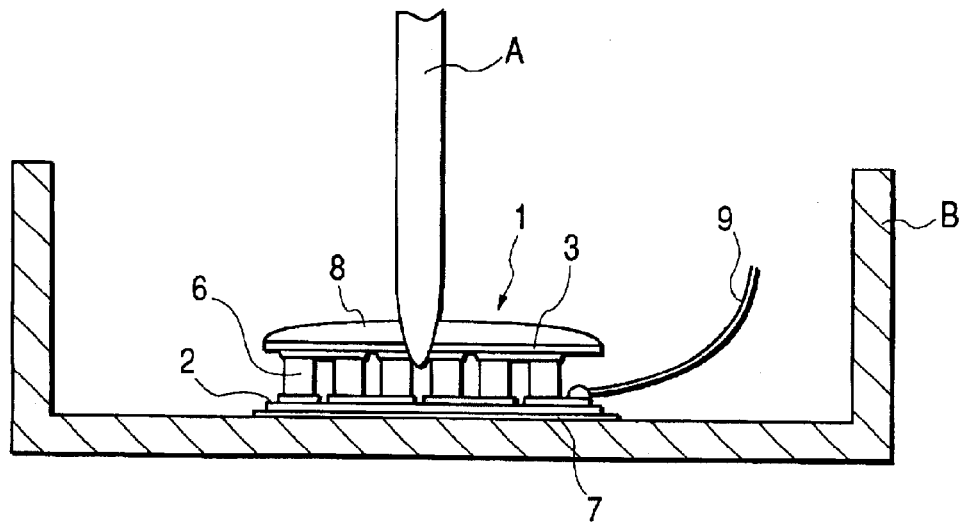
FIG. 12 is a partially broken-down front view showing a method of assembling the thermoelectric module shown in FIG. 10 in the radiating member.
Figure 13:
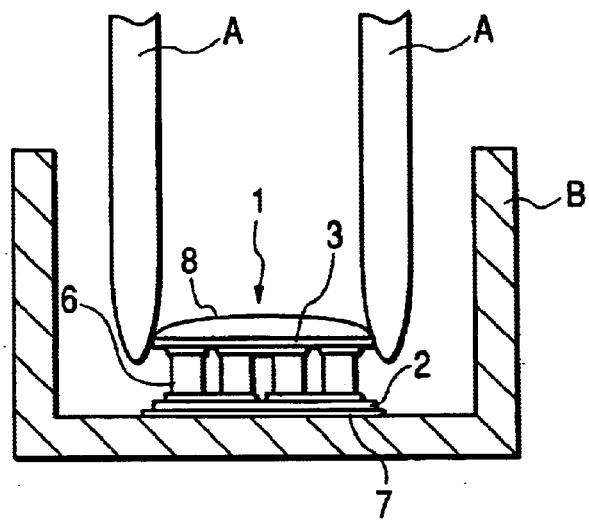
FIG. 13 is a partially broken-down right side view of FIG. 12.
Figure 14:
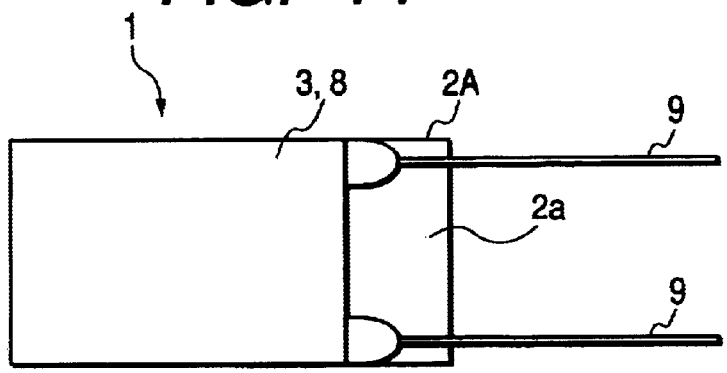
FIG. 14 is a plan view showing another example of a thermoelectric module in the related art.
Figure 15:
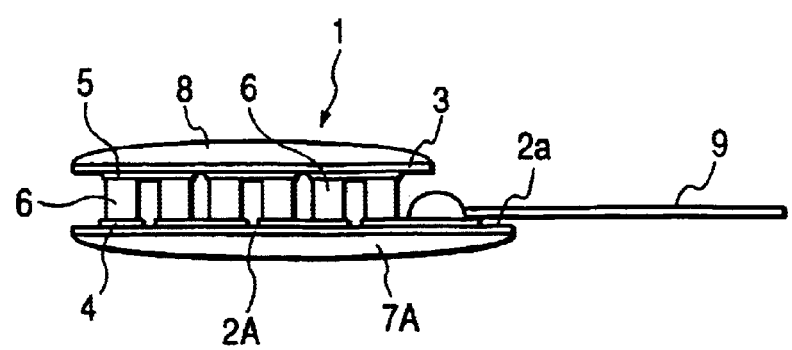
FIG. 15 is a front view showing the thermoelectric module shown in FIG. 14.

In a comparative example 1, in the above-mentioned thermoelectric module 1 shown in FIGS. 10 and 11, first solder, second solder 7 and third solder 8 are identical with the first solder, the second solder 16 and the third solder 17 in the above-mentioned first to third embodiments. A lower substrate 2 of the thermoelectric module 1 is mounted on a butterfly package B that has been heated to 225 to 230° C. through the second solder 7, and the thermoelectric module 1 is assembled in the butterfly package B in the above-mentioned method shown in FIGS. 12 and 13.

As a result of investigating whether the thermoelectric module 1 of the comparative example 1 after having been assembled in the butterfly package B has been broken, or not, in the same method as that described above, it has been judged that 5 products were defective among 22 test products, and the results were defective as a whole, as shown in Tables 1 and 2.

COMPARATIVE EXAMPLE 2

A comparative Example 2 differs from the comparative example 1 in that the second solder 7 is solder of Sn/Pb=50/50 (183° C. in solidus temperature, 212° C. in liquidus temperature). As a result of investigating whether the thermoelectric module 1 of the comparative example 2 after having been assembled in the butterfly package B has been damaged, or not, in the same method as that described above, it has been judged that 5 products were defective among 22 test products, and the results were defective as a whole, as shown in Table 2.

COMPARATIVE EXAMPLE 3

A comparative Example 3 differs from the comparative example 1 in that the second solder 7 is eutectic solder of Sn/Zn=91/9 (199° C. in melting point). As a result of investigating whether the thermoelectric module 1 of the comparative example 3 after having been assembled in the butterfly package B has been broken, or not, in the same method as that described above, it has been judged that 2 products were defective among 22 test products, and the results were defective as a whole, as shown in Table 2.

COMPARATIVE EXAMPLE 4

A comparative Example 4 differs from the comparative example 1 in that the second solder 7 is solder of Sn/Pb=75/25 (183° C. in solidos temperature, 192° C. in liquidos temperature). As a result of investigating whether the thermoelectric module 1 of the comparative example 4 after having been assembled in the butterfly package B has been broken, or not, in the same method as that described above, it has been judged that no defective product existed in 22 test products, and the results were good as a whole, as shown in Table 2.

TABLE 2

|  | Comparative Example 1 | Comparative Example 2 | Comparative Example 3 | Comparative Example 4 |
|---|---|---|---|---|
| Second solder | Sn/Ag = 96.5/3.5 | Sn/Pb = 50/50 | Sn/Zn = 91/9 | Sn/Pb = 75/25 |
| Second solder liquidos temp. | 221° C. (eutectic) | 212° C. | 199° C. (eutectic) | 192° C. |
| Temp. difference from first solder solidos temp. | 11° C. | 20° C. | 33° C. | 40° C. |
| The number of defects after bonding | 5/22 | 5/22 | 2/22 | 0/22 |
| Judgment | X | X | X | ○ |

Those four comparative examples exhibit that, in the method of assembling the thermoelectric module 1 in the related art shown in FIGS. 10 to 13 in the butterfly package B, if a temperature difference between the liquidus temperature of the second solder and the solidus temperature of the first solder is 40° C. or higher, the bonding portions of the thermoelectric semiconductor chips and the electrodes through the first solder are not broken by a force exerted on the thermoelectric semiconductor chips, whereas if the temperature difference is lower than 40° C., there is the high possibility that the bonding portions of the thermoelectric semiconductor chips and the electrodes through the first solder are broken, resulting in a broken thermoelectric module.

On the contrary, according to the thermoelectric module 10 of the above-mentioned respective embodiments, since the lower substrate 11 has a pair of protrusions 11a that protrude relative to both ends of the upper substrate 12 in the longitudinal direction, when the lower substrate 11 is assembled in the butterfly package B, the respective protrusions 11a are held by the leading edges of the corresponding support arms to push the lower substrate 11 toward the butterfly package B under pressure without being slanted, so as to be bonded to the butterfly package B through the melted solder. Also, since the lower substrate 11 is rocked in the direction orthogonal to the pushing direction by the support arms A, foreign material such as air bubbles or dust is extruded laterally from the interior of the melted second solder 16 interposed between the lower substrate 11 and the butterfly package B so as to be removed, and the second solder 16 is thinned and uniformed in thickness with the result that a heat resistance between the lower substrate 11 and the butterfly package B can be lessened. Moreover, since the forces for pushing and rocking the lower substrate 11 are transmitted not through the thermoelectric semiconductor chips 15 but directly to the lower substrate 11 through the respective protrusions 11a, even when a temperature difference between the liquidus temperature of the second solder 16 and the solidus temperature of the first solder is small, the bonding portions of the respective thermoelectric semiconductor chips 15 and the electrodes 13, 14 are not broken, and therefore there is no fear that the thermoelectric module 10 is broken.

According to the second embodiment where the aperture portions 11b are formed in the respective protrusions 11a of the lower substrate 11, the leading edges of the support arms A that push the respective protrusions 11a of the lower substrate 11 under pressure are fittingly inserted into the aperture portions 11b to enable the lower substrate 11 to be surely rocked in the direction orthogonal to the pushing direction, the melted solder interposed between the lower substrate 11 and the butterfly package B attached to the lower substrate 11 is surely thinned and uniformed in thickness, and a removal of foreign material such as air bubbles or dust from the solder is ensured. As a result, the heat resistance between the lower substrate 11 and the butterfly package B is further reduced, thereby being capable of sufficiently exhibiting the performance of the thermoelectric module 10.

Also, according to the third embodiment where the concaves 19a are formed in the centers of the convexes 19 disposed on the respective protrusions 11a of the lower substrate 11, the leading edges of the support arms A that push the respective protrusions 11a of the lower substrate 11 are engaged with the concaves 19a to surely rock the lower substrate 11 in the direction orthogonal to the pushing direction. Therefore, the heat resistance between the lower substrate 11 and the butterfly package B can be reduced likewise. Alternatively, even when convexes are defined in the respective protrusions 11a instead of the aperture portions 11b or the concaves 19a, and the convexes on the protrusions 11a are fittingly inserted into concaves formed in the leading edges of the support arms A, the same effects and advantages as those described above can be obtained.

The protrusions 11a formed on the lower substrate 11 are not limited to a pair of protrusions that protrude from both ends of the upper substrate 12 in the longitudinal direction, but there may be provided an arbitrary number of protrusions shaped in Y, X or the like.

As was described above, according to the thermoelectric module of this invention, since the first substrate has at least two protrusions that protrude in the opposite directions with respect to the second substrate, the support arms push the respective protrusions of the first substrate under pressure to push the first substrate toward the radiating member without being slanted or rock the first substrate in the direction orthogonal to the pushing direction, thereby being capable of bonding the first substrate to the radiating member through the melted solder. Since forces for pushing and rocking the first substrate are transmitted not through the thermoelectric semiconductor chips but directly to the first substrate from the respective protrusions, the bonding portions of the thermoelectric semiconductor chips and the electrodes through the first solder are not broken, and accordingly there is no fear that the thermoelectric module is broken.

Also, according to this embodiment, since the convexes, the concaves or the aperture portions are formed in the protrusions of the first substrate, the leading edges of members that push the respective protrusions of the first substrate under pressure are engaged with the convexes, the concaves or the aperture portions, thereby being capable of surely rocking the first substrate in the direction orthogonal to the pushing direction. Hence, the melted solder interposed between the first substrate and the radiating member is thinned and uniformed in thickness, as a result of which the heat resistance between the lower substrate 2 and the radiating member can be reduced.

Further, in the method of assembling the thermoelectric module in the radiating member according to this embodiment, since the respective protrusions of the first substrate of the above-mentioned thermoelectric module are pushed by the leading edges of the corresponding support arms, and the first substrate is pushed toward the radiating member under pressure while being rocked in the direction orthogonal to the pushing direction, foreign material such as air bubbles or dust is removed from the interior of the melted second solder interposed between the first substrate and the radiating member, and the second solder is thinned and uniformed in thickness with the result that the heat resistance between the first substrate and the radiating member can be reduced. Moreover, since forces for pushing and rocking the first substrate are transmitted not through the thermoelectric semiconductor chips but directly to the first substrate from the respective protrusions, even when the temperature difference between the liquidus temperature of the second solder and the solidus temperature of the first solder is small, the bonding portions of the thermoelectric semiconductor chips and the electrodes through the first solder are not broken, and therefore there is no fear that the thermoelectric module is broken.

Further, according to this embodiment, in the method of assembling the thermoelectric module in the radiating member, since the leading edges of the support arms are engaged with the convexes, the concaves or the aperture portions of the protrusions to push and rock the first substrate by the support arms, the rocking of the first substrate in the direction orthogonal to the pushing direction is surely conducted, thereby being capable of reducing the heat resistance between the first substrate and the radiating member, and also of improving a precision in the positioning of the first substrate with respect to the radiating member.

The foregoing description of the preferred embodiments of the invention has been presented for purposes of illustration and description. It is not intended to be exhaustive or to limit the invention to the precise form disclosed, and modifications and variations are possible in light of the above teachings or maybe acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A thermoelectric module, comprising:
   a plurality of thermoelectric semiconductor chips;
   first and second substrates;
   a plurality of first and second electrodes formed on said first and second substrates, respectively; and
   a first solder through which said first and second electrodes are bonded to respective end portions of said thermoelectric semiconductor chips in order to connect the plural thermoelectric semiconductor chips in series,
   said first substrate being made to include at least two protrusions that protrude toward opposite sides which appear at-a-right-angle projection of the second substrate onto the first substrate.

2. The thermoelectric module according to claim 1, wherein concave portions, convex portions or aperture portions are formed in the protrusions of said first substrate.

3. A method of assembling a thermoelectric module in a radiating member, comprising the steps of:
   mounting the first substrate of the thermoelectric module according to claim 1 on a radiating member through second solder having a liquidus temperature lower than a solidus temperature of the first solder;
   holding the respective protrusions of the first substrate by leading edges of corresponding support arms in a state where the second solder is melted, and pushing the first substrate toward the radiating member under pressure while rocking the first substrate in a direction orthogonal to the pushing direction.

4. The method according to claim 3, wherein the leading edges of the support arms are engaged with the concave portions, the convex portions or the aperture portions, and the first substrate is pushed under pressure and rocked by the support arms.

5. The method according to claim 3, wherein a temperature difference between a liquidus temperature of the second solder and a solidus temperature of the first solder is set to be lower than 40° C.

* * * * *